(12) United States Patent
Sahu et al.

(10) Patent No.: US 10,146,900 B2
(45) Date of Patent: Dec. 4, 2018

(54) HYBRID DIFFUSION STANDARD LIBRARY CELLS, AND RELATED SYSTEMS AND METHODS

(71) Applicant: QUALCOMM Incorporated, San Diego, CA (US)

(72) Inventors: Satyanarayana Sahu, San Diego, CA (US); Renukprasad Shreedhar Hiremath, San Diego, CA (US); Radhika Vinayak Guttal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/857,552

(22) Filed: Sep. 17, 2015

(65) Prior Publication Data

US 2017/0083653 A1    Mar. 23, 2017

(51) Int. Cl.
*G06F 17/50* (2006.01)
*H01L 23/525* (2006.01)
(Continued)

(52) U.S. Cl.
CPC ........ *G06F 17/5068* (2013.01); *H01L 23/525* (2013.01); *H01L 27/0207* (2013.01);
(Continued)

(58) Field of Classification Search
CPC ............. G06F 17/5081; G06F 17/5045; G06F 17/5068; G03F 1/144; G03F 1/36;
(Continued)

(56) References Cited

U.S. PATENT DOCUMENTS 5,304,871 A * 4/1994 Dharmarajan ......... G11C 17/16
                                                  326/30
7,062,739 B2   6/2006 Monthie et al.
(Continued)

OTHER PUBLICATIONS

International Search Report and Written Opinion for PCT/US2016/050072, dated Dec. 6, 2016, 14 pages.
(Continued)

*Primary Examiner* — Vuthe Siek
(74) *Attorney, Agent, or Firm* — W&T/Qualcomm (57) ABSTRACT

Hybrid diffusion standard library cells, and related systems and methods are disclosed. The hybrid diffusion standard library cells may be fabricated with reduced costs because masks corresponding to fixed base layers remain constant across integrated circuit (IC) devices. In one aspect, a hybrid diffusion standard library cell is provided. The hybrid diffusion standard library cell employs multiple diffusion regions, wherein a break region separates at least two of the multiple diffusion regions. The hybrid diffusion standard library cell includes one or more MEOL interconnects at fixed locations that are configured to connect transistors to a first metal layer. The hybrid diffusion standard library cell includes at least one transistor. Including the break region between multiple diffusion regions helps to limit the locations of the fixed MEOL interconnects, which limits possible locations for base level transistors and fixes the base layer design.

23 Claims, 10 Drawing Sheets

(51) Int. Cl.
*H01L 27/02* (2006.01)
*H01L 27/118* (2006.01)

(52) U.S. Cl.
CPC .................. *H01L 27/11807* (2013.01); *H01L 2027/11875* (2013.01)

(58) Field of Classification Search
CPC ........... H01L 21/76283; H01L 21/8228; H01L 21/8238; H01L 27/092; H01L 27/1203; H01L 2027/11875; H01L 23/525; H01L 27/0207; H01L 27/11807
See application file for complete search history.

(56) References Cited

U.S. PATENT DOCUMENTS

| | | | |
|---|---|---|---|
| 7,698,680 | B2 | 4/2010 | Kim |
| 7,965,107 | B2 | 6/2011 | Ciccarelli et al. |
| 8,341,588 | B2 | 12/2012 | Herzl et al. |
| 8,390,330 | B2 | 3/2013 | Ciccarelli et al. |
| 8,446,176 | B1* | 5/2013 | Yang .................. G06F 17/5068 257/401 |
| 8,680,626 | B2* | 3/2014 | Smayling .......... H01L 21/28518 257/211 |
| 2003/0159121 | A1* | 8/2003 | Tseng ................ H03K 19/00361 716/114 |
| 2007/0109832 | A1 | 5/2007 | Hou et al. |
| 2012/0240088 | A1* | 9/2012 | Guo ...................... G06F 17/505 716/104 |
| 2013/0087834 | A1 | 4/2013 | Park et al. |
| 2014/0124868 | A1* | 5/2014 | Kamal ................ H01L 27/0207 257/369 |
| 2014/0310670 | A1* | 10/2014 | Oberai ................ G06F 17/5081 716/112 |
| 2015/0221639 | A1 | 8/2015 | Chen et al. |
| 2015/0379174 | A1* | 12/2015 | Chang ................ G06F 17/5022 716/107 |

OTHER PUBLICATIONS

Second Written Opinion for PCT/US2016/050072, dated Oct. 12, 2017, 7 pages.
International Preliminary Report on Patentability for PCT/US2016/050072, dated Jan. 16, 2018, 21 pages.

* cited by examiner

HYBRID DIFFUSION STANDARD LIBRARY CELLS, AND RELATED SYSTEMS AND METHODS

BACKGROUND

I. Field of the Disclosure

The technology of the disclosure relates generally to standard library cells, and particularly to use and reuse of standard library cells to design logic circuits.

II. Background

Processor-based computer systems can include a vast array of integrated circuits (ICs). Each IC has a complex layout design comprised of multiple IC devices. Standard library cells are often employed to assist in making the design of such ICs less complex and more manageable. In particular, standard library cells provide a designer with pre-designed cells corresponding to commonly used IC devices that conform to specific design rules of a chosen technology. As non-limiting examples, standard library cells may include gates, inverters, multiplexers, and adders. Standard library cells corresponding to such IC devices in a standard library may include uniform complementary metal-oxide semiconductor (CMOS) base layers and base interconnects. For example, standard library cells corresponding to an inverter and a multiplexer may each include uniform base interconnects disposed on base p-type diffusion and base n-type diffusion regions that are configured to support n-type MOS (NMOS) and p-type MOS (PMOS) transistors, respectively. Thus, the standard library cells corresponding to the inverter and the multiplexer have compatible base designs, but differ with respect to layers added to the p-type and n-type diffusion regions and base interconnects.

In addition to standard library cells that correspond to certain IC devices, IC designs may include programmable cells commonly referred to as engineering change order (ECO) standard library cells. Such ECO standard library cells are employed as spare cells in IC designs, wherein the ECO standard library cells may be programmed after the IC design has been finalized for fabrication. Such programming is achieved by fabricating updated masks wherein corresponding layers of the ECO standard library cells have been altered to reflect design changes. As a non-limiting example, upon finalizing an IC design for fabrication, masks corresponding to the IC design are fabricated. However, the IC design may be altered following finalization so as to change certain properties of the IC design, such as the timing of signals or the functionality of a set of gates. Thus, the IC design may be changed to accommodate these changes by programming ECO standard library cells to function as a buffer for timing purposes or to function as an inverter to change the polarity of a signal to ensure a desired operation.

However, as fabrication technology size continues to decrease, the time and costs associated with programming ECO standard library cells and fabricating corresponding masks may increase. For example, programming ECO standard library cells at fabrication technology sizes of ten nanometers (10 nm) and below may involve altering multiple layers of the ECO standard library cells. Each layer that is altered may result in one or more masks being re-fabricated, which increases the corresponding time and costs of fabricating the IC. Therefore, it would be advantageous to employ ECO standard library cells as fabrication technology size continues to decrease while mitigating the time and costs associated with fabricating ECO standard library cells.

SUMMARY OF THE DISCLOSURE

Aspects disclosed in the detailed description include hybrid diffusion standard library cells, and related systems and methods. The hybrid diffusion standard library cells provide a fixed base layer design while allowing for various functions to be designed in the higher levels of the cells. In this manner, the hybrid diffusion standard library cells may be fabricated with reduced costs because masks corresponding to the fixed base layers remain constant across different integrated circuit (IC) devices. Thus, in one exemplary aspect, a hybrid diffusion standard library cell is provided. The "hybrid diffusion" standard library cell is a standard library cell that employs multiple diffusion regions. A break region in the hybrid diffusion standard library cell separates at least two of the multiple diffusion regions. Additionally, the hybrid diffusion standard library cell includes one or more fixed middle-end-of-line (MEOL) interconnects at fixed locations that are configured to connect corresponding transistors to a first metal layer. In this manner, including the break region between multiple diffusion regions helps to limit possible locations for base level transistors and fixes the base layer design.

In addition to cells designed to function as a particular IC device, engineering change order (ECO) standard library cells may be programmed to achieve a desired functionality. Programming an ECO standard library cell includes configuring layers within the cell so that the cell performs a desired function, wherein masks associated with the configured layers are fabricated to reflect the changes. Thus, the hybrid diffusion standard library cells may be employed as ECO standard library cells wherein the number of masks that may be programmed is limited, which mitigates the time and costs associated with fabricating an IC.

In this regard in one aspect, a standard library cell is provided. The standard library cell comprises at least one transistor. The standard library cell further comprises a plurality of diffusion regions, wherein at least one diffusion region of the plurality of diffusion regions corresponds to the at least one transistor. The standard library cell further comprises one or more break regions separating at least two diffusion regions of the plurality of diffusion regions. The standard library cell further comprises one or more fixed MEOL interconnects configured to connect the at least one transistor to a first metal layer.

In another aspect, a non-transitory computer-readable medium having stored thereon computer data for a cell library that comprises a plurality of standard library cells for an IC design is provided. Each of the standard library cells comprises at least one transistor. Each of the standard library cells further comprises a plurality of diffusion regions, wherein at least one diffusion region of the plurality of diffusion regions corresponds to the at least one transistor. Each of the standard library cells further comprises one or more break regions separating at least two diffusion regions of the plurality of diffusion regions. Each of the standard library cells further comprises one or more fixed MEOL interconnects configured to connect the at least one transistor to a first metal layer.

In another aspect, a method of manufacturing a standard library cell is provided. The method comprises disposing a plurality of diffusion regions on a substrate. The method further comprises providing one or more break regions that separate at least two diffusion regions of the plurality of diffusion regions. The method further comprises forming at least one transistor corresponding to at least one of the plurality of diffusion regions. The method further comprises disposing one or more fixed MEOL interconnects configured to connect the at least one transistor to a first metal layer.

In another aspect, a method for programming an ECO standard library cell is provided. The method comprises configuring one or more non-fixed zero level vias to be disposed on one or more fixed second layer MEOL interconnects, wherein one of the one or more fixed second layer MEOL interconnects is disposed in a break region that separates two or more diffusion regions. The method further comprises configuring one or more first metal layer segments to be disposed so that one or more of the one or more first metal layer segments couples to one or more of the one or more non-fixed zero level vias. The method further comprises configuring one or more of the one or more first metal layer segments to be disposed so that one or more of the one or more first metal layer segments couples to one or more fixed zero level vias.

DETAILED DESCRIPTION

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 1:
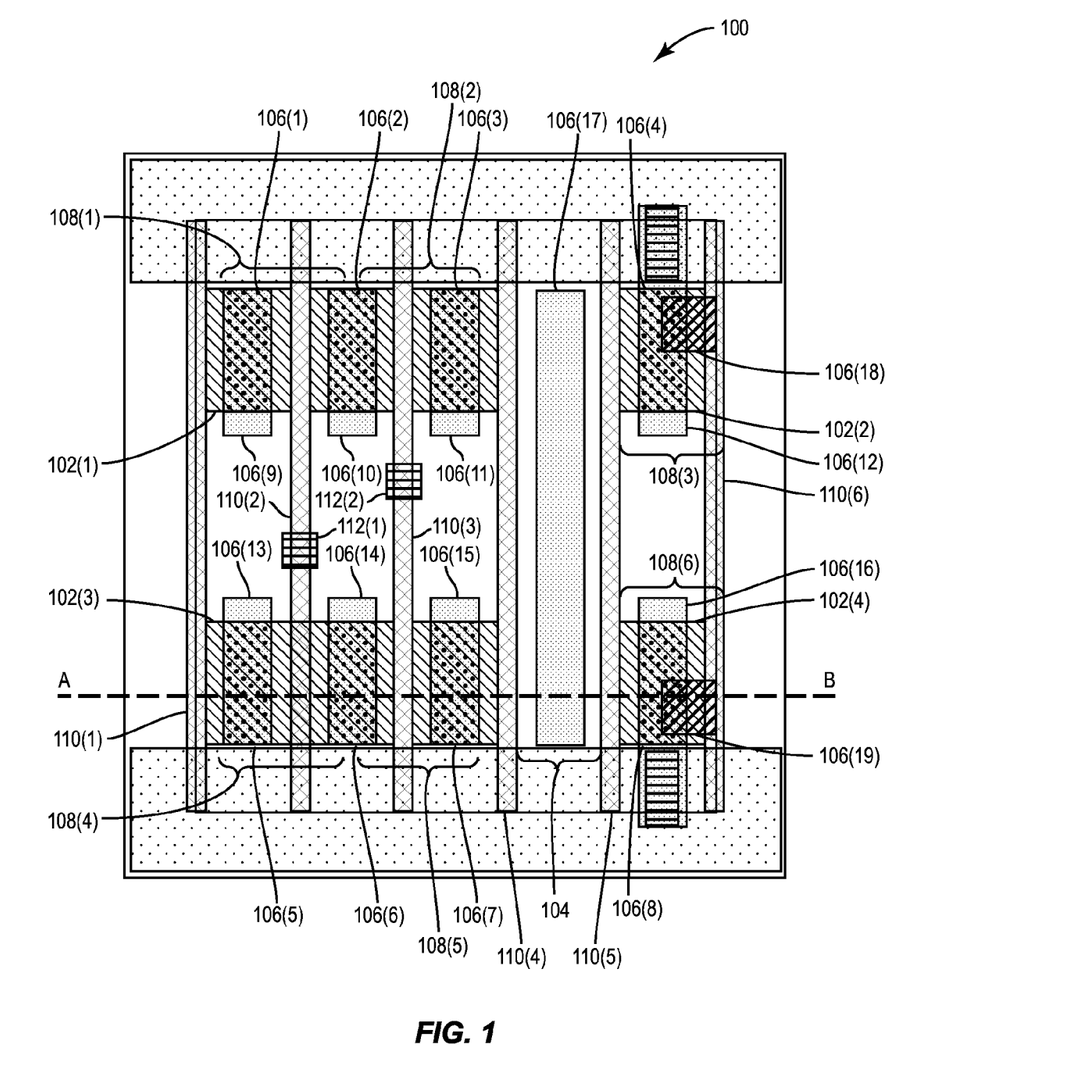
FIG. 1 is an exemplary layout diagram of an exemplary hybrid diffusion standard library cell employing a break region that separates diffusion regions, and employing fixed middle-end-of-line (MEOL) interconnects.

FIG. 1 illustrates an exemplary layout diagram of an exemplary hybrid diffusion standard library cell 100. The hybrid diffusion standard library cell 100 provides a fixed base level design while allowing for various functions to be designed in the higher levels of the hybrid diffusion standard library cell 100. In this manner, the hybrid diffusion standard library cell 100 may be fabricated with reduced costs because masks corresponding to the fixed base layers remain constant across different instances of the hybrid diffusion standard library cell 100. Thus, in this aspect, the hybrid diffusion standard library cell 100 is a standard library cell that employs multiple diffusion regions 102(1)-102(4). The hybrid diffusion standard library cell 100 also includes a break region 104 that separates the diffusion regions 102(1), 102(2), and also separates the diffusion regions 102(3), 102(4). Additionally, the hybrid diffusion standard library cell 100 includes fixed MEOL interconnects 106(1)-106(19) that are configured to connect corresponding transistors 108(1)-108(6) to a first metal layer (not shown).

As described in more detail below, the transistors 108(1), 108(2), 108(4), and 108(5) include four (4) terminals (gate, drain, source, and body), and thus, are also referred to herein as 4-terminal active transistors 108(1), 108(2), 108(4), and 108(5). However, because the transistors 108(3), 108(6) each only include three (3) terminals (i.e., gate, body, and either a drain or a source), the transistors 108(3), 108(6) cannot function as full 4-terminal active transistors. Thus, the transistors 108(3), 108(6) are also referred to herein as 3-terminal floating transistors 108(3), 108(6). Additionally, the hybrid diffusion standard library cell 100 includes gates 110(1)-110(6). Notably, the gates 110(2), 110(3) correspond to the 4-terminal active transistors 108(1), 108(2), 108(4), and 108(5), and thus, are also referred to herein as active gates 110(2), 110(3). The gates 110(1), 110(4), 110(5), and 110(6) do not correspond to the 4-terminal active transistors 108(1), 108(2), 108(4), and 108(5). Thus, the gates 110(1), 110(4), 110(5), and 110(6) are also referred to herein as floating gates 110(1), 110(4), 110(5), and 110(6).

With continuing reference to FIG. 1, the active gate 110(2) corresponds to the 4-terminal active transistors 108(1), 108(4), the active gate 110(3) corresponds to the 4-terminal active transistors 108(2), 108(5), and the floating gates 110(5), 110(6) correspond to the 3-terminal floating transistors 108(3), 108(6). As described in more detail below, including the break region 104 between the diffusion regions 102(1), 102(2) and 102(3), 102(4) helps to limit the locations of the fixed MEOL interconnects 106(1)-106(19). This is true, in part, because the break region 104 removes a diffusion region that would otherwise be located on the right side of the floating gate 110(4). Without the diffusion region on the right side of the floating gate 110(4), the floating gate 110(4) cannot correspond to a 4-terminal active transistor. Thus, the floating gate 110(4) may forego being tied-off when the 4-terminal active transistors 108(2), 108(5) associated with the active gate 110(3) are unused. However, when another cell is placed to the right of the hybrid diffusion standard library cell 100, diffusion regions of the new cell may create a 4-terminal active transistor corresponding to the floating gate 110(6). Thus, the floating gate 110(6) is tied-off in the hybrid diffusion standard library cell 100 to prevent activation of a potential 4-terminal active transistor. Limiting the tie-off to the floating gate 110(6) to prevent activation of such a 4-terminal active transistor helps to limit the base layer design by limiting changes to masks associated with the tie-off. Further, the hybrid diffusion standard library cell 100 may be employed as an ECO standard library cell where it is desired to limit the number of masks to be programmed, which may mitigate the time and costs associated with fabricating an integrated circuit (IC).

With continuing reference to FIG. 1, this aspect includes the fixed MEOL interconnect 106(17) disposed in the break region 104 (also referred to as the "first break region 104" or "first break region 104(1)"). Notably, the fixed MEOL interconnect 106(17) in this aspect is employed in a second MEOL layer (also referred to as the "fixed second layer MEOL interconnect 106(17)"). Further, the fixed second layer MEOL interconnect 106(17) is configured to interconnect multiple first metal layer segments (not shown). Notably, the first metal layer segments refer to the metal layer in the hybrid standard library cell 100 disposed above a first MEOL layer and the second MEOL layer (e.g., the first metal layer may be a metal one (M1) layer). As a non-limiting example, the fixed second layer MEOL interconnect 106(17) allows for first metal layer segments (e.g., M1 segments) disposed above the diffusion region 102(1) to be connected to first metal layer segments disposed above the diffusion region 102(3). Notably, without the fixed second layer MEOL interconnect 106(17), second metal layer segments (e.g., metal two (M2) segments) may be employed to connect first metal layer segments above the diffusion region 102(1) to first metal layer segments corresponding to the diffusion region 102(3). Thus, employing the fixed second layer MEOL interconnect 106(17) in this manner may reduce the amount of second metal layer segments employed to route and connect first metal layer segments. Further, in this aspect, the fixed second layer MEOL interconnect 106(17) corresponds to a second interconnect mask and a tie-off interconnect mask for fabrication. Therefore, fixing the location of the fixed second layer MEOL interconnect 106(17) reduces the number of masks that may be changed following finalization of an IC design, which may mitigate the time and costs associated with fabricating an IC.

With continuing reference to FIG. 1, this aspect includes the fixed MEOL interconnects 106(1)-106(8) disposed in a first layer MEOL (also referred to as the "first layer MEOL interconnects 106(1)-106(8)"). Additionally, the first layer MEOL interconnects 106(1)-106(8) correspond to the fixed MEOL interconnects 106(9)-106(16) disposed in the second layer MEOL (also referred to as the "second layer MEOL interconnects 106(9)-106(16)"). In this manner, the first layer MEOL interconnects 106(1)-106(8) are configured to connect the second layer MEOL interconnects 106(9)-106(16) to corresponding transistors 108(1)-108(6) formed in the diffusion regions 102(1)-102(4). Notably, in this aspect the first layer MEOL interconnects 106(1)-106(8) correspond to a first interconnect mask and the tie-off interconnect mask for fabrication. Additionally, this aspect also includes fixed zero level vias 112(1), 112(2) configured to connect the active gates 110(2), 110(3) to first metal layer segments (not shown). Notably, the fixed zero level vias 112(1), 112(2) correspond to the the first interconnect mask and a zero level mask for fabrication. Thus, fixing the location of the first layer MEOL interconnects 106(1)-106(8), the second layer MEOL interconnects 106(9)-106(17), and the fixed zero level vias 112(1), 112(2) reduces the number of masks that may be changed following finalization of an IC design, which may mitigate the time and costs associated with fabricating an IC.

With continuing reference to FIG. 1, this aspect includes the fixed MEOL interconnects 106(18), 106(19) disposed in a tie-off layer (also referred to as "tie-off layer interconnects 106(18), 106(19)"). In this manner, the tie-off layer interconnects 106(18), 106(19) are configured to tie-off the floating gate 110(6) to a known value so as to deactivate the corresponding 3-terminal floating transistors 108(3), 108(6). Tying off the 3-terminal floating transistors 108(3), 108(6) in this manner fixes the location of the tie-off layer interconnects 106(18), 106(19), which enables the 4-terminal active transistors 108(1), 108(2), 108(4), and 108(5) to be reserved for use in an IC design. Further, the tie-off layer interconnects 106(18), 106(19) in this aspect corresponds to the tie-off interconnect mask and the zero level mask for fabrication. Thus, fixing the location of the tie-off layer interconnects 106(18), 106(19) reduces the number of masks that may be changed following finalization of an IC design, which may mitigate the time and costs associated with fabricating an IC.

Notably, in this aspect, the diffusion regions 102(1), 102(2) (also referred to as "first diffusion region 102(1)," "second diffusion region 102(2)") are p-type metal-oxide semiconductor (PMOS) regions. Further, the diffusion regions 102(3), 102(4) (also referred to as "third diffusion region 102(3)," "fourth diffusion region 102(4)") are n-type MOS (NMOS) regions. Thus, the hybrid diffusion standard library cell 100 may be employed in the design of complementary MOS (CMOS) ICs.

Figure 2:
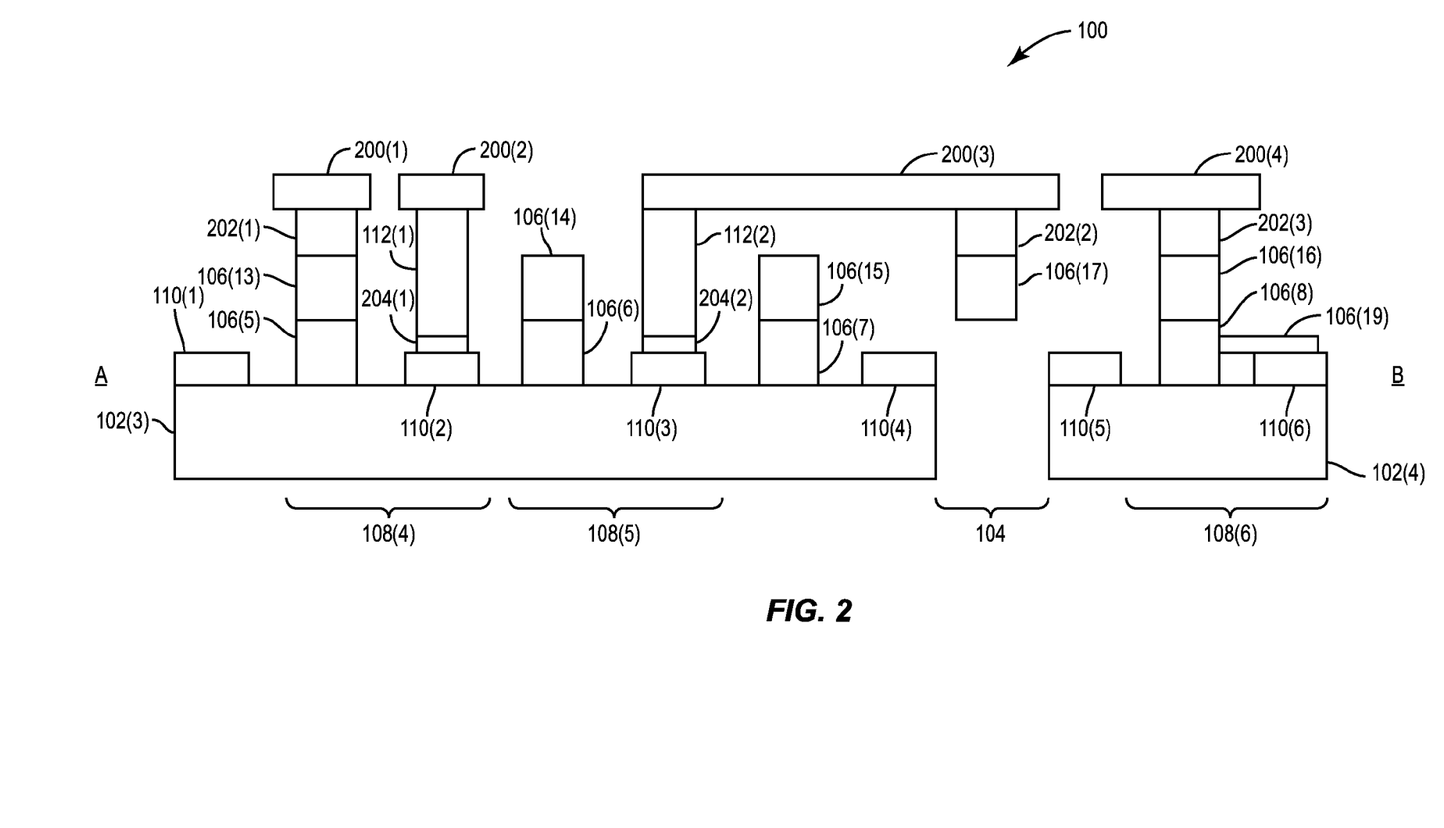
FIG. 2 is a cross-sectional diagram of the exemplary hybrid diffusion standard library cell in FIG. 1 that employs the break region and the fixed MEOL interconnects.

To illustrate additional details of the aspect described above, FIG. 2 provides a cross-sectional diagram of the exemplary hybrid diffusion standard library cell 100 of FIG. 1. The cross-sectional diagram of FIG. 2 illustrates layers of the hybrid diffusion standard library cell 100 associated with the third and fourth diffusion regions 102(3), 102(4). Notably, although not illustrated in FIG. 2, layers associated with the first and second diffusion regions 102(1), 102(2) include similar details.

With continuing reference to FIG. 2, the first layer MEOL interconnects 106(5)-106(8) are configured to connect the second layer MEOL interconnects 106(13)-106(16) to corresponding transistors 108(4)-108(6) formed in the diffusion regions 102(3), 102(4). In this manner, the first layer MEOL interconnects 106(5)-106(7) are coupled to the third diffusion region 102(3), and the second layer MEOL interconnects 106(13)-106(15) are coupled to the first layer MEOL interconnects 106(5)-106(7), respectively. As a non-limiting example, to connect a first metal layer segment 200(1) to the third diffusion region 102(3), a non-fixed zero level via 202(1) may be coupled to the second layer MEOL interconnect 106(13). The non-fixed zero level via 202(1) is configured to couple the first metal layer segment 200(1) to the second layer MEOL interconnect 106(13), which is coupled to the third diffusion region 102(3) using the first layer MEOL interconnect 106(5). In this manner, the first and second layer MEOL interconnects 106(5)-106(7), 106(13)-106(15) are configured to couple first metal layer segments 200 generally to drains and sources of the 4-terminal active transistors 108(4), 108(5) corresponding to the third diffusion region 102(3).

With continuing reference to FIG. 2, the fixed zero level vias 112(1), 112(2) are configured to connect the active gates 110(2), 110(3) to first metal layer segments 200(2), 200(3), respectively. In this manner, the fixed zero level via 112(1) is coupled to the active gate 110(2) using a MEOL interconnect 204(1). Similarly, the fixed zero level via 112(2) is coupled to the active gate 110(3) using a MEOL interconnect 204(2). In this manner, first metal layer segments 200(2), 200(3) are coupled to the fixed zero level vias 112(1), 112(2), respectively, to provide input signals to the active gates 110(2), 110(3). Further, as previously described, the fixed second layer MEOL interconnect 106(17) is disposed in the break region 104. A non-fixed zero level via 202(2) may be coupled to the top of the fixed second layer MEOL interconnect 106(17) to couple the first metal layer segment 200(3) corresponding to the third diffusion region 102(3) to first metal layer segments 200 corresponding to the first and second diffusion regions 102(1), 102(2) (not shown in FIG. 2). Thus, signals may be routed from the first and second diffusion regions 102(1), 102(2) to the third and fourth diffusion regions 102(3), 102(4) using the fixed second layer MEOL interconnect 106(17).

With continuing reference to FIG. 2, the tie-off layer interconnect 106(19) is configured to tie-off the floating gate 110(6) to a known value so as to deactivate the corresponding 3-terminal floating transistor 108(6). The tie-off layer interconnect 106(19) is coupled to the floating gate 110(6) and to the first layer MEOL interconnect 106(8). Further, the first layer MEOL interconnect 106(8) is coupled to a first metal layer segment 200(4) by way of the second layer MEOL interconnect 106(16) and a non-fixed zero level via 202(3). Coupling the tie-off layer interconnect 106(19) in this manner forces the 3-terminal floating transistor 108(6) to a known state in case a diffusion region of another cell is disposed next to the hybrid diffusion standard library cell 100. Tying off the 3-terminal floating transistor 108(6) in this manner also fixes the location of the tie-off layer interconnect 106(19), which enables the 4-terminal active transistors 108(4), 108(5) to be reserved for use in an IC design rather than being tied-off.

Figure 3:
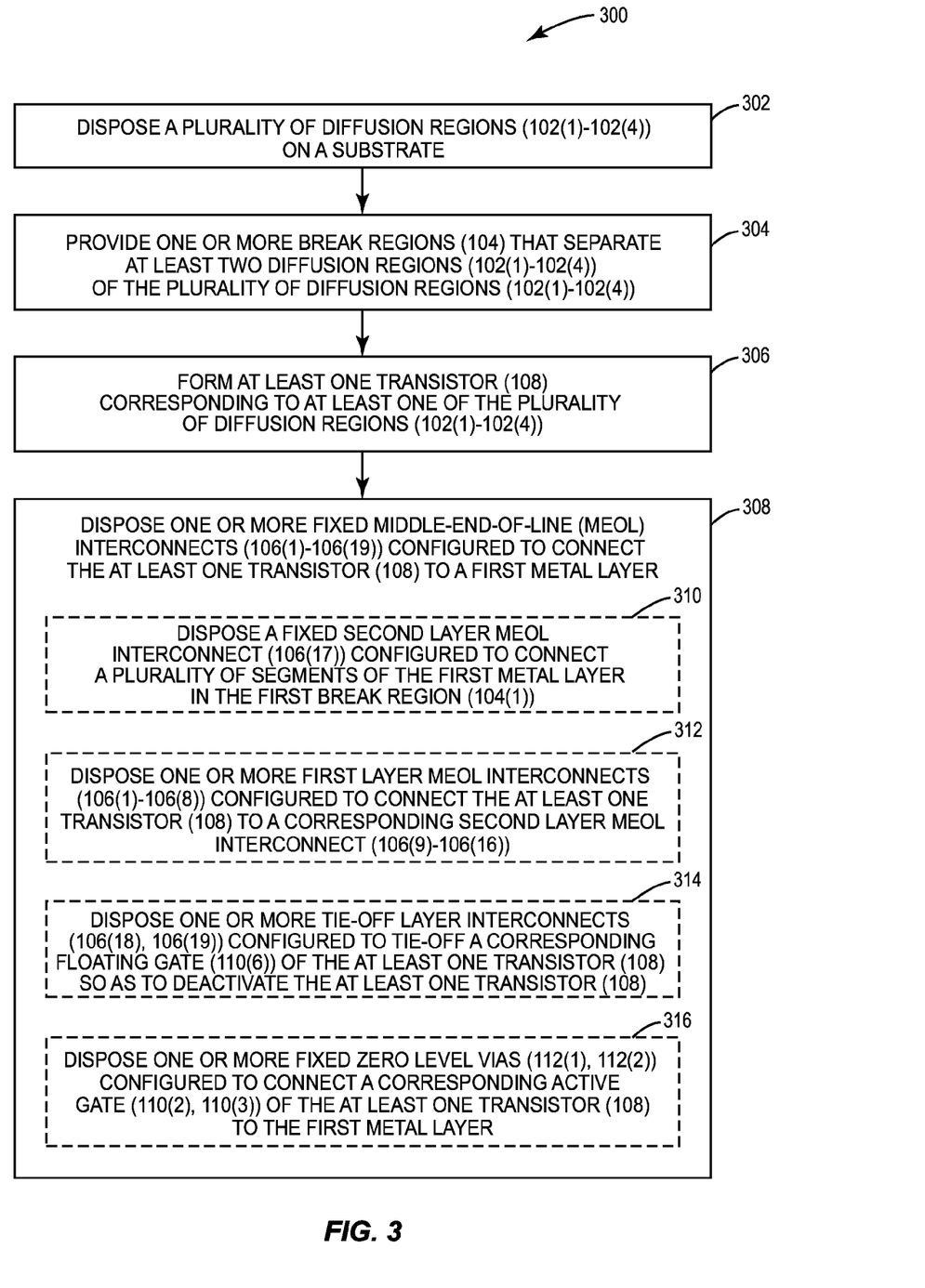
FIG. 3 is a flowchart of an exemplary method for manufacturing the hybrid diffusion standard library cell in FIG. 1.

In this regard, FIG. 3 illustrates an exemplary process 300 for manufacturing the hybrid diffusion standard library cell 100 of FIG. 1. The process 300 includes disposing the diffusion regions 102(1)-102(4) on a substrate (block 302). The process 300 also includes providing one or more break regions 104 that separate the at least two diffusion regions 102(1)-102(4) of the plurality of diffusion regions 102(1)-102(4) (block 304). The process 300 also includes forming at least one transistor 108 corresponding to at least one of the diffusion regions 102(1)-102(4) (block 306). Further, the process 300 includes disposing the one or more fixed MEOL interconnects 106(1)-106(19) configured to connect the at least one transistor 108 to the first metal layer (block 308). Disposing the fixed MEOL interconnects 106(1)-106(19) may include disposing the fixed second layer MEOL interconnect 106(17) configured to connect segments of the first metal layer in the first break region 104(1) (block 310). Disposing the fixed MEOL interconnects 106(1)-106(19) may also include disposing the first layer MEOL interconnects 106(1)-106(8) configured to connect the at least one transistor 108 to the corresponding second layer MEOL interconnects 106(9)-106(16) (block 312). Further, disposing the fixed MEOL interconnects 106(1)-106(19) may include disposing the tie-off layer interconnects 106(18), 106(19) configured to tie-off the corresponding floating gate 110(6) of the at least one transistor 108 so as to deactivate the at least one transistor 108 (block 314).

With continuing reference to FIG. 3, the process 300 includes disposing the fixed zero level vias 112(1), 112(2) configured to connect a corresponding active gate 110(2), 110(3) of the at least one transistor 108 to the first metal layer (block 316). In this manner, including the break region 104 between the diffusion regions 102(1), 102(2) and 102(3), 102(4) helps to limit the locations of the fixed MEOL interconnects 106(1)-106(19), which limits possible locations for base level transistors and fixes the base layer design. Thus, the hybrid diffusion standard library cell 100 manufactured using the process 300 may be employed as ECO standard library cells wherein the number of masks that may be programmed is limited, which may mitigate the time and costs associated with fabricating an IC.

Figure 4:
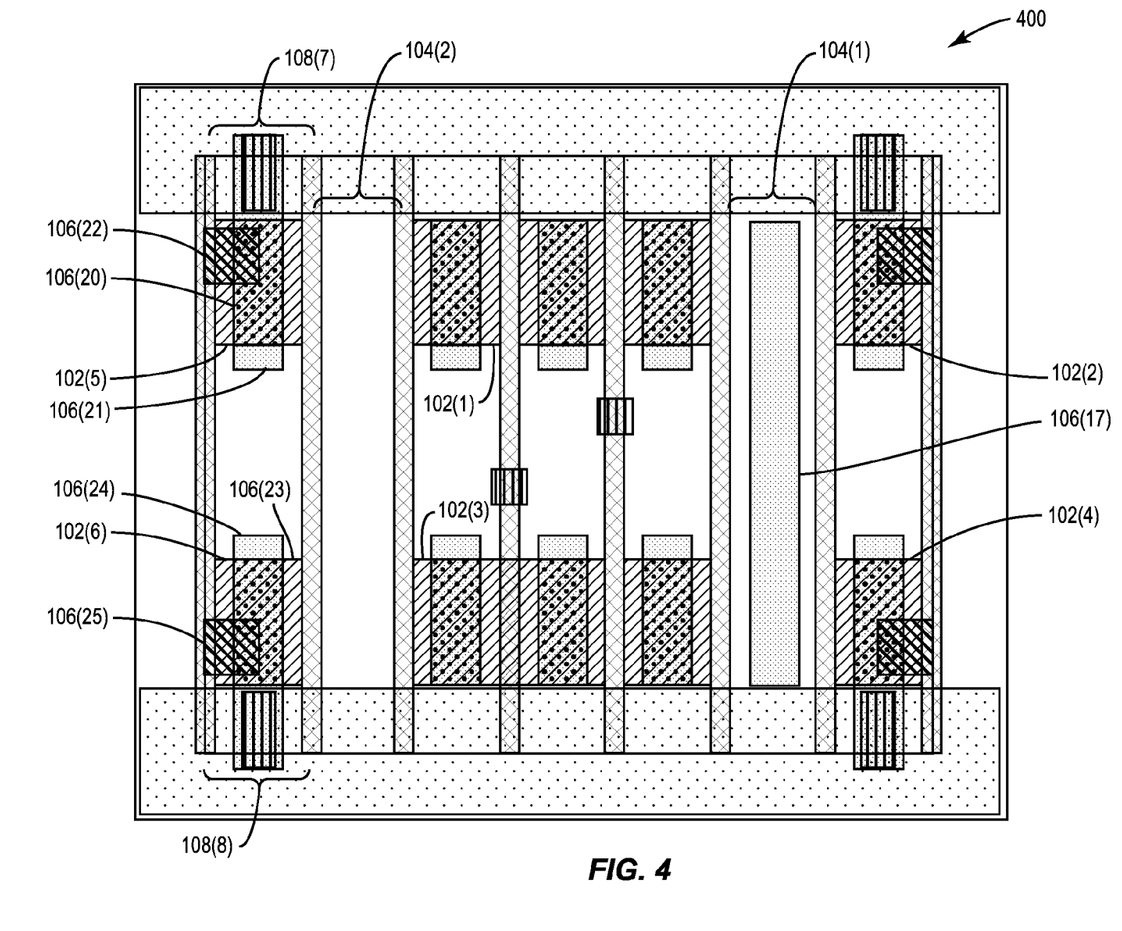
FIG. 4 is an exemplary layout diagram of an exemplary hybrid diffusion standard library cell employing two break regions that separate diffusion regions, and employing fixed MEOL interconnects.

In addition to the hybrid diffusion standard library cell 100 of FIG. 1, other aspects may include additional elements and provide similar benefits. In this regard, FIG. 4 illustrates an exemplary hybrid diffusion standard library cell 400 employing two (2) break regions 104(1), 104(2). Notably, the hybrid diffusion standard library cell 400 includes certain components similar to the hybrid diffusion standard library cell 100 of FIG. 1. Such components have the same associated number in FIG. 4 as in FIG. 1, and thus will not be re-described herein. Thus, while the hybrid diffusion standard library cell 400 employs the first break region 104(1) similar to the hybrid diffusion standard library cell 100, a second break region 104(2) is also employed. The second break region 104(2) separates a fifth diffusion region 102(5) from the first diffusion region 102(1). Further, the second break region 104(2) separates a sixth diffusion region 102(6) from the third diffusion region 102(3). In this aspect, the second break region 104(2) does not include a MEOL interconnect, while the first break region 104(1) includes the fixed second layer MEOL interconnect 106(17). Further, because the fifth diffusion region 102(5) is separated from the first diffusion region 102(1), the fifth diffusion region 102(5) employs a first layer MEOL interconnect 106(20), a second layer MEOL interconnect 106(21), and a tie-off layer interconnect 106(22) to tie-off the transistor 108(7). Additionally, the sixth diffusion region 102(6) employs a first layer MEOL interconnect 106(23), a second layer MEOL interconnect 106(24), and a tie-off layer interconnect 106(25) to tie-off the transistor 108(8).

Figure 5:
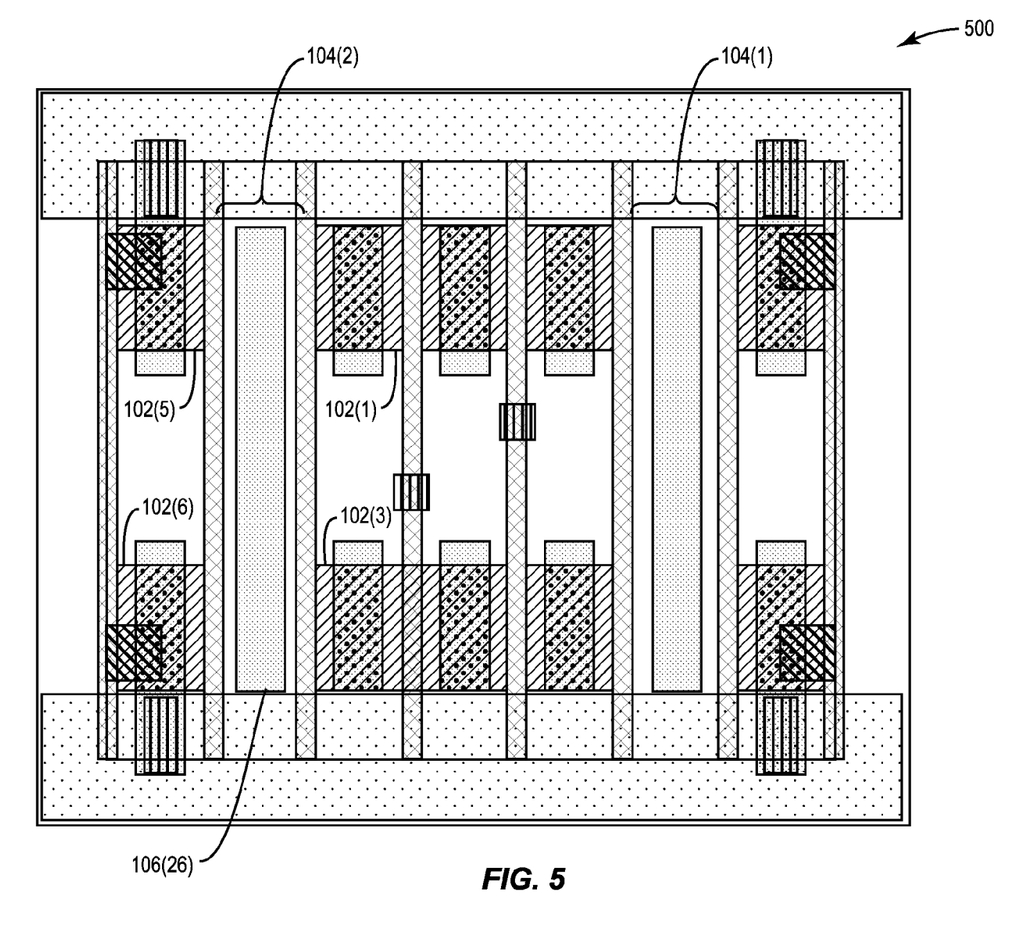
FIG. 5 is an exemplary layout diagram of another exemplary hybrid diffusion standard library cell employing two break regions that separate diffusion regions, and employing fixed MEOL interconnects.

Additionally, FIG. 5 illustrates an exemplary hybrid diffusion standard library cell 500 employing the two (2) break regions 104(1), 104(2). The hybrid diffusion standard library cell 500 includes certain components similar to the hybrid diffusion standard library cell 400 of FIG. 4. Such components have the same associated number in FIG. 5 as in FIG. 4, and thus will not be re-described herein. In this regard, the hybrid diffusion standard library cell 500 employs a fixed MEOL interconnect 106(26) in the second break region 104(2). Notably, this aspect employs the fixed MEOL interconnect 106(26) in the second MEOL layer (also referred to as the "second layer MEOL interconnect 106(26)"). Thus, the hybrid diffusion standard library cell 500 may route signals from the first and fifth diffusion regions 102(1), 102(5) to the third and sixth diffusion regions 102(3), 102(6) by way of the second layer MEOL interconnect 106(26).

As previously described, aspects of the hybrid diffusion standard library cells 100, 400, and 500 described herein may be employed as ECO hybrid diffusion standard library cells that are configured to be programmed for a desired function. In one aspect, an exemplary process may be employed to program an ECO hybrid diffusion standard library cell. The process includes configuring one or more non-fixed zero level vias to be disposed on one or more fixed second layer MEOL interconnects. In this aspect, one of the fixed second layer MEOL interconnects is disposed in a break region that separates two or more diffusion regions. Further, the process includes configuring one or more first metal layer segments to be disposed so that one or more of the first metal layer segments couples to one or more of the non-fixed zero level vias. Additionally, the process includes configuring one or more of the first metal layer segments to be disposed so that one or more of the first metal layer segments couples to one or more fixed zero level vias. As a non-limiting example, configuring the first level vias and the first metal layer segments may include configuring the non-fixed zero level vias and the first metal layer segments so that the ECO hybrid diffusion standard library cell functions as an inverter. As another non-limiting example, configuring the first level vias and the first metal layer segments may include configuring the non-fixed zero level vias and the first metal layer segments so that the ECO hybrid diffusion standard library cell functions as a buffer.

Figure 6:
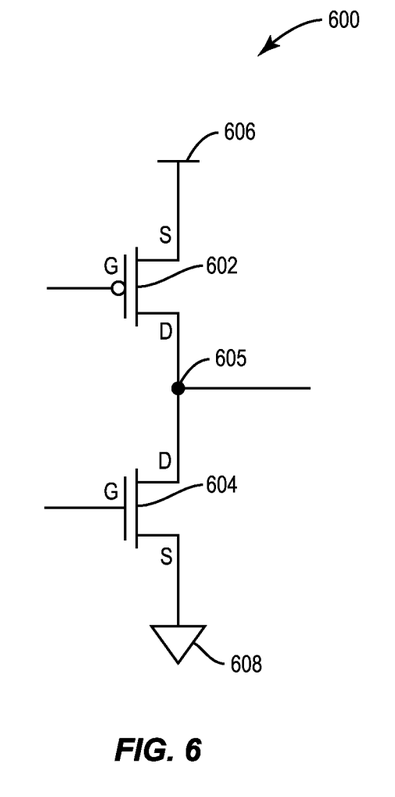
FIG. 6 is a transistor-level diagram of an exemplary inverter.

In this regard, FIG. 6 illustrates a transistor-level diagram of an exemplary inverter 600. The inverter 600 includes a PMOS transistor 602 whose drain (D) is coupled to a drain (D) of an NMOS transistor 604, thus forming an output 605. Further, a voltage supply 606 is coupled to a source (S) of the PMOS transistor 602, while a ground source 608 is coupled to a source (S) of the NMOS transistor 604. A gate (G) of the PMOS transistor 602 and a gate (G) of the NMOS transistor 604 are each configured to receive an input signal (not shown).

Figure 7:
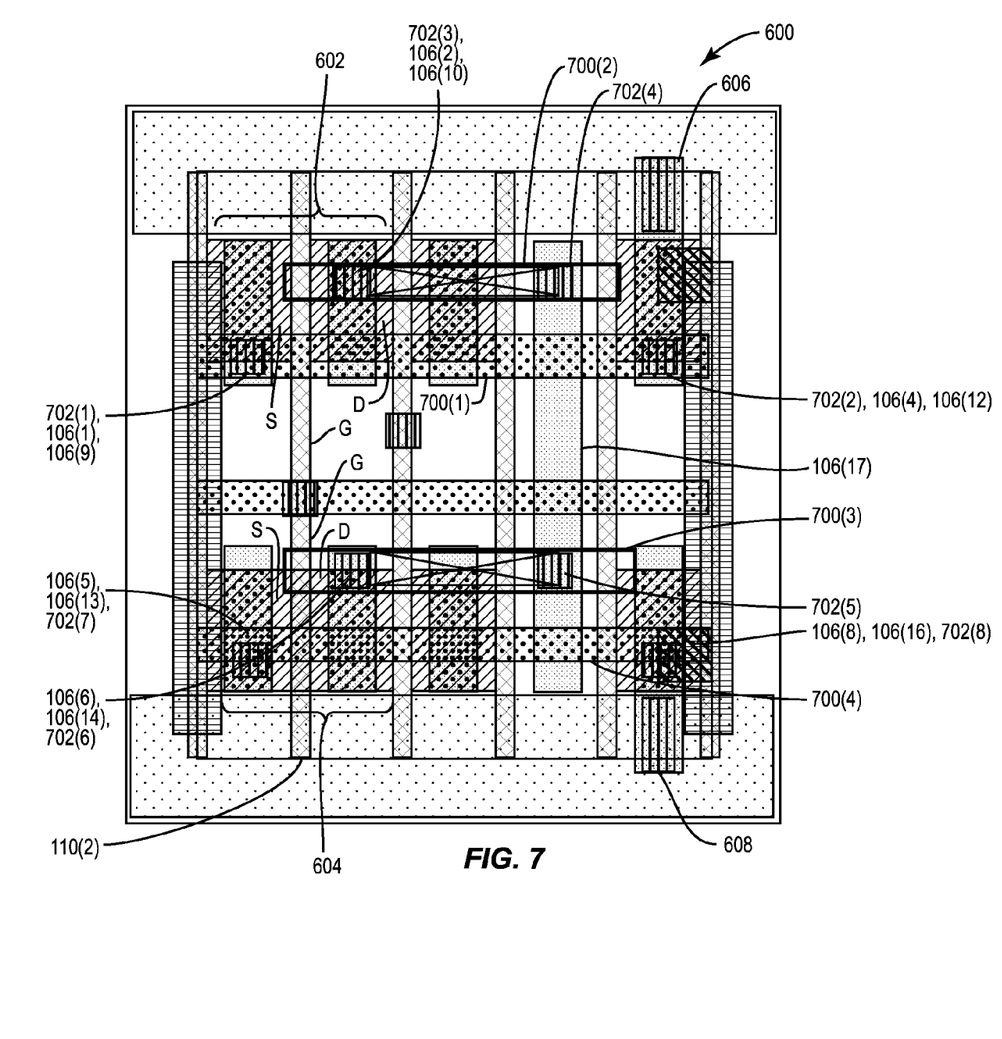
FIG. 7 is a layout diagram of the inverter in FIG. 6 designed using a hybrid diffusion standard library cell that employs a break region and fixed MEOL interconnects.

In this regard, FIG. 7 illustrates the inverter 600 in FIG. 6 designed using the hybrid diffusion standard library cell 100 in FIG. 1. The inverter 600 includes certain components similar to the hybrid diffusion standard library cell 100. Such components have the same associated number in FIG. 7 as in FIG. 1, and thus will not be re-described herein. In this manner, the active gate 110(2) is configured to serve as the gate (G) of the PMOS transistor 602 and the gate (G) of the NMOS transistor 604. The source (S) of the PMOS transistor 602 is coupled to the voltage supply 606 by way of a first metal layer segment 700(1). Thus, the first metal layer segment 700(1) is coupled to the source (S) of the PMOS transistor 602 using a first level via 702(1) and the fixed MEOL interconnects 106(1), 106(9). The first metal layer segment 700(1) is coupled to the voltage supply 606 using a first level via 702(2) and the fixed MEOL interconnects 106(4), 106(12). The drain (D) of the PMOS transistor 602 is coupled to the drain (D) of the NMOS transistor 604 by way of the fixed second layer MEOL interconnect 106(17). Thus, a first metal layer segment 700(2) is coupled to the drain (D) of the PMOS transistor 602 using a first level via 702(3) and the fixed MEOL interconnects 106(2), 106(10). Further, the first metal layer segment 700(2) is coupled to the fixed second layer MEOL interconnect 106(17) by way of a first level via 702(4).

With continuing reference to FIG. 7, the fixed second layer MEOL interconnect 106(17) is coupled to the drain (D) of the NMOS transistor 604 using a first metal layer segment 700(3). Thus, the first metal layer segment 700(3) is coupled to the fixed second layer MEOL interconnect 106(17) by way of a first level via 702(5). Further, the first metal layer segment 700(3) is coupled to the drain (D) of the NMOS transistor 604 by way of a first level via 702(6) and the fixed MEOL interconnects 106(6), 106(14). The source (S) of the NMOS transistor 604 is coupled to the ground source 608 by way of a first metal layer segment 700(4). Thus, the first metal layer segment 700(4) is coupled to the source (S) of the NMOS transistor 604 using a first level via 702(7) and the fixed MEOL interconnects 106(5), 106(13). Further, the first metal layer segment 700(4) is coupled to the ground source 608 using a first level via 702(8) and the fixed MEOL interconnects 106(8), 106(16). Thus, as described above, programming the hybrid diffusion standard library cell 100 in FIG. 1 to design the inverter 600 in this manner may mitigate the time and costs associated with fabricating an IC employing the inverter 600.

Figure 8:
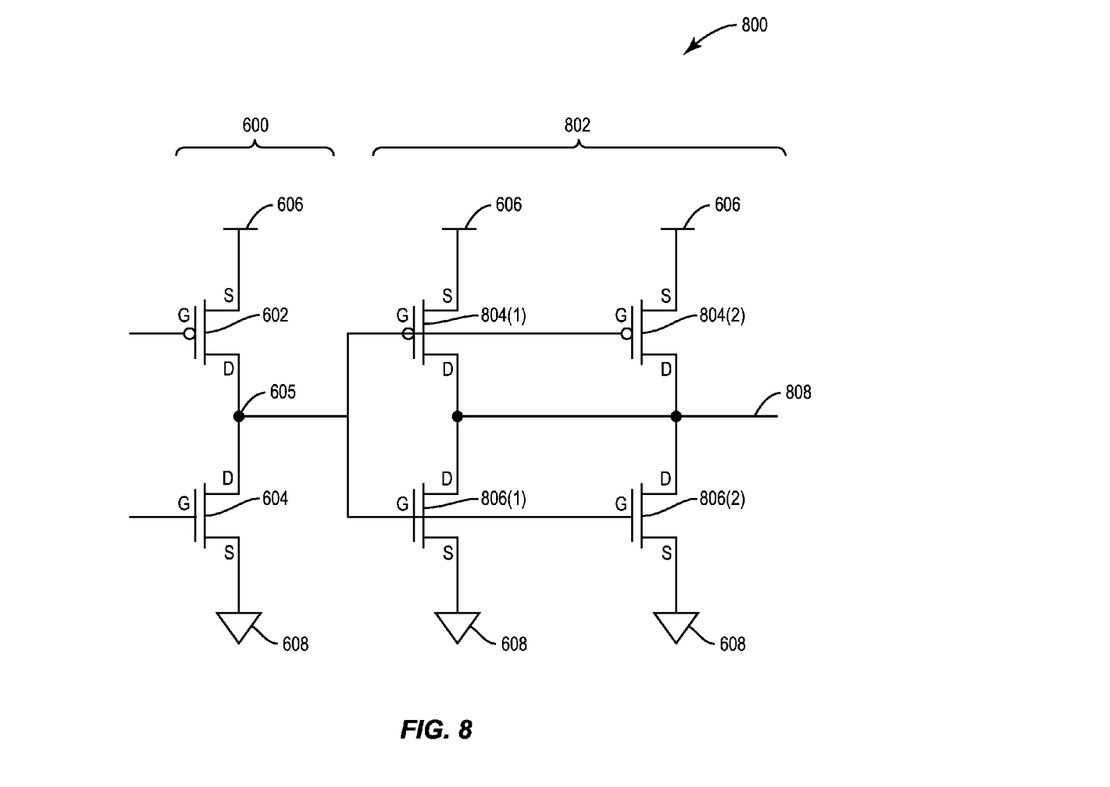
FIG. 8 is a transistor-level diagram of an exemplary buffer.

Additionally, FIG. 8 illustrates a transistor-level diagram of an exemplary buffer 800 that includes two inverters 600, 802. Notably, the inverter 600 has been previously described in FIG. 6, and thus will not be re-described herein. Further, the inverter 802 is similar to the inverter 600, although the inverter 802 includes two PMOS transistors 804(1), 804(2) and two NMOS transistors 806(1), 806(2) rather than one PMOS transistor 602 and one NMOS transistor 604. The inverter 802 includes the PMOS transistors 804(1), 804(2) and NMOS transistors 806(1), 806(2) so as to have a greater strength of which to drive an output 808.

With continuing reference to FIG. 8, the PMOS transistor 804(1) includes a drain (D) coupled to a drain (D) of the NMOS transistor 806(1). Similarly, the PMOS transistor 804(2) includes a drain (D) coupled to a drain (D) of the NMOS transistor 806(2). Further, a voltage supply 606 is coupled to a source (S) of the PMOS transistor 804(1) and a source (S) of the PMOS transistor 804(2), while a ground source 608 is coupled to a source (S) of the NMOS transistor 806(1) and a source (S) of the NMOS transistor 806(2). The PMOS transistors 804(1), 804(2) and the NMOS transistors 806(1), 806(2) each include a gate (G) coupled to the output 605 of the inverter 600.

Figure 9:
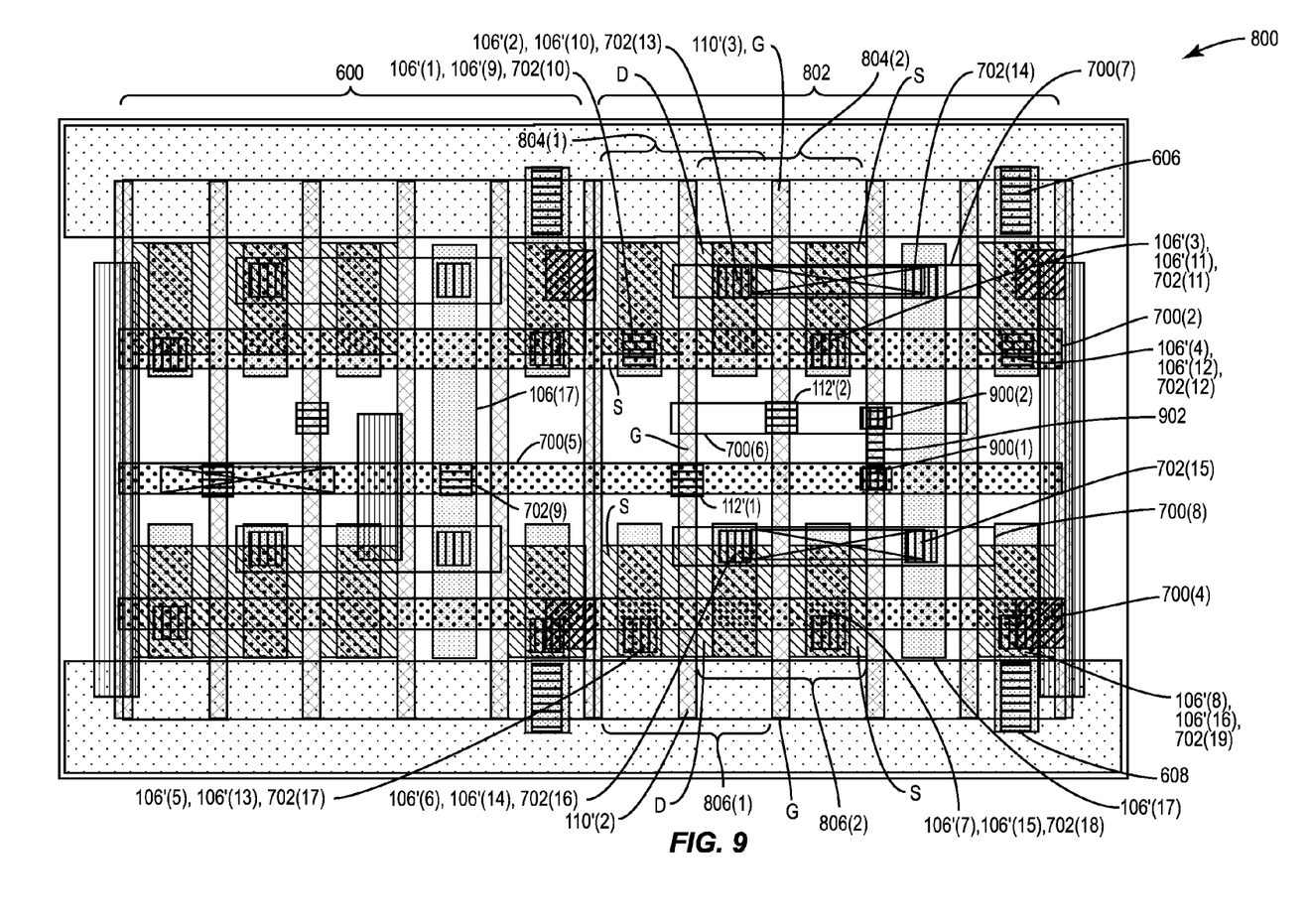
FIG. 9 is a layout diagram of the buffer in FIG. 8 designed using a hybrid diffusion standard library cell that employs a break region and fixed MEOL interconnects.

In this regard, FIG. 9 illustrates the buffer 800 in FIG. 8 employing the inverters 600, 802 that are designed using the hybrid diffusion standard library cell 100 in FIG. 1. The buffer 800 includes certain components similar to the hybrid diffusion standard library cell 100. Such components having the number "X" in FIG. 1 have a number "X'" in FIG. 9, and thus will not be re-described herein.

In this manner, the inverter 600 includes the same structure as described in FIG. 7. Further, the active gate 110'(2) is configured to serve as the gate (G) of the PMOS transistor 804(1) and the gate (G) of the NMOS transistor 806(1). The active gate 110'(3) is configured to serve as the gate (G) of the PMOS transistor 804(2) and the gate (G) of the NMOS transistor 806(2). The fixed second layer MEOL interconnect 106(17) of the inverter 600 is coupled to the active gate 110'(2) using a first metal layer segment 700(5). The first metal layer segment 700(5) is coupled to the fixed second layer MEOL interconnect 106(17) by way of a first level via 702(9) and to the active gate 110'(2) using the zero level via 112'(1). The active gate 110'(2) is coupled to the active gate 110'(3) by way of the first metal layer segment 700(5), a second level via 900(1), a second metal layer segment 902, a second level via 900(2), and a first metal layer segment 700(6). The first metal layer segment 700(6) is coupled to the active gate 110'(3) by way of the zero level via 112'(2). The source (S) of the PMOS transistor 804(1) and the source (S) of the PMOS transistor 804(2) are each coupled to the voltage supply 606 by way of the first metal layer segment 700(2). Thus, the first metal layer segment 700(2) is coupled to the source (S) of the PMOS transistor 804(1) using a first level via 702(10) and the fixed MEOL interconnects 106'(1), 106'(9). The first metal layer segment 700(2) is coupled to the source (S) of the PMOS transistor 804(2) using a first level via 702(11) and the fixed MEOL interconnects 106'(3), 106'(11). The first metal layer segment 700(2) is coupled to the voltage supply 606 using a first level via 702(12) and the fixed MEOL interconnects 106'(4), 106'(12). The PMOS transistors 804(1), 804(2) share a drain (D), which is coupled to a shared drain (D) of the NMOS transistors 806(1), 806(2) by way of the second layer MEOL interconnect 106'(17). Thus, a first metal layer segment 700(7) is coupled to the shared drain (D) of the PMOS transistors 804(1), 804(2) using a first level via 702(13) and the fixed MEOL interconnects 106'(2), 106'(10). Further, the first metal layer segment 700(7) is coupled to the second layer MEOL interconnect 106'(17) by way of a first level via 702(14).

With continuing reference to FIG. 9, the second layer MEOL interconnect 106'(17) is coupled to the shared drain (D) of the NMOS transistors 806(1), 806(2) using a first metal layer segment 700(8). Thus, the first metal layer segment 700(8) is coupled to the second layer MEOL interconnect 106'(17) by way of a first level via 702(15). Further, the first metal layer segment 700(8) is coupled to the shared drain (D) of the NMOS transistors 806(1), 806(2) by way of a first level via 702(16) and the fixed MEOL interconnects 106'(6), 106'(14). The source (S) of the NMOS transistor 806(1) and the source (S) of the NMOS transistor 806(2) are each coupled to the ground source 608 by way of the first metal layer segment 700(4). Thus, the first metal layer segment 700(4) is coupled to the source (S) of the NMOS transistor 806(1) using a first level via 702(17) and the fixed MEOL interconnects 106'(5), 106'(13). The first metal layer segment 700(4) is coupled to the source (S) of the NMOS transistor 806(2) using a first level via 702(18) and the fixed MEOL interconnects 106'(7), 106'(15). Further, the first metal layer segment 700(4) is coupled to the ground source 608 using a first level via 702(19) and the fixed MEOL interconnects 106'(8), 106'(16). Thus, as described above, programming the hybrid diffusion standard library cell 100 in FIG. 1 to design the buffer 800 in this manner may mitigate the time and costs associated with fabricating an IC employing the buffer 800.

The hybrid diffusion standard library cells according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 10:
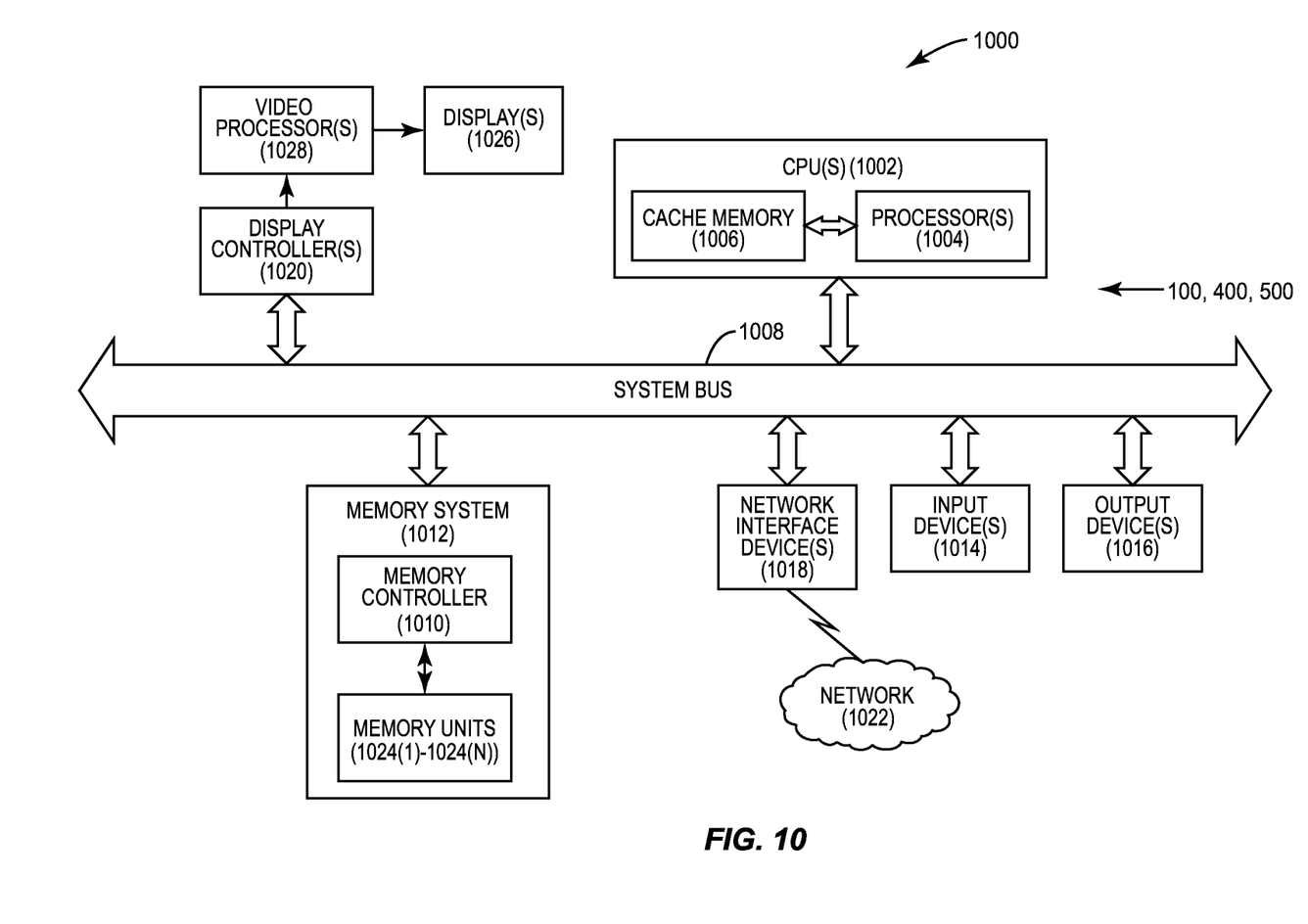
FIG. 10 is a block diagram of an exemplary processor-based system that can include integrated circuits (ICs) that employ the hybrid diffusion standard library cell of FIG. 1.

In this regard, FIG. 10 illustrates an example of a processor-based system 1000. Notably, any element described herein in relation to the processor-based system 100 having an IC can include the hybrid diffusion standard library cells 100, 400, and 500 illustrated in FIGS. 1, 4, and 5, respectively. In this example, the processor-based system 1000 includes one or more central processing units (CPUs) 1002, each including one or more processors 1004. The CPU(s) 1002 may be a master device. The CPU(s) 1002 may have cache memory 1006 coupled to the processor(s) 1004 for rapid access to temporarily stored data. The CPU(s) 1002 is coupled to a system bus 1008 and can intercouple master and slave devices included in the processor-based system 1000. As is well known, the CPU(s) 1002 communicates with these other devices by exchanging address, control, and data information over the system bus 1008. For example, the CPU(s) 1002 can communicate bus transaction requests to a memory controller 1010 as an example of a slave device. Although not illustrated in FIG. 10, multiple system buses 1008 could be provided, wherein each system bus 1008 constitutes a different fabric.

Other master and slave devices can be connected to the system bus 1008. As illustrated in FIG. 10, these devices can include a memory system 1012, one or more input devices 1014, one or more output devices 1016, one or more network interface devices 1018, and one or more display controllers 1020, as examples. The input device(s) 1014 can include any type of input device, including but not limited to input keys, switches, voice processors, etc. The output device(s) 1016 can include any type of output device, including but not limited to audio, video, other visual indicators, etc. The network interface device(s) 1018 can be any devices configured to allow exchange of data to and from a network 1022. The network 1022 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1018 can be configured to support any type of communications protocol desired. The memory system 1012 can include one or more memory units 1024(1)-1024(N).

The CPU(s) 1002 may also be configured to access the display controller(s) 1020 over the system bus 1008 to control information sent to one or more displays 1026. The display controller(s) 1020 sends information to the display(s) 1026 to be displayed via one or more video processors 1028, which process the information to be displayed into a format suitable for the display(s) 1026. The display(s) 1026 can include any type of display, including but not limited to a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in data and/or instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A standard library cell circuit, comprising:
   at least one transistor;
   a plurality of diffusion regions, wherein at least one diffusion region of the plurality of diffusion regions corresponds to the at least one transistor;
   one or more break regions separating at least two diffusion regions of the plurality of diffusion regions;
   the at least one transistor comprising at least one first floating gate disposed between a first diffusion region among the plurality of diffusion regions and the one or more break regions, the at least one first floating gate not tied off;
   at least one second floating gate disposed between a second diffusion region among the plurality of diffusion regions and the one or more break regions;
   a first fixed middle-end-of-line (MEOL) interconnect disposed in a first break region of the one or more break regions, the first fixed MEOL interconnect not connected to the at least one first floating gate and the at least one second floating gate; and
   one or more second fixed MEOL interconnects configured to connect the at least one transistor to a first metal layer, wherein one or more of the one or more second fixed MEOL interconnects comprises one or more tie-off layer interconnects, each of the one or more tie-off layer interconnects configured to tie-off the at least one first floating gate of the at least one transistor so as to deactivate the at least one transistor.

2. The standard library cell circuit of claim 1, wherein the first fixed MEOL interconnect disposed in the first break region comprises a fixed second layer MEOL interconnect configured to connect a plurality of first metal layer segments disposed above at least two diffusion regions of the plurality of diffusion regions.

3. The standard library cell circuit of claim 1, wherein one or more of the one or more second fixed MEOL interconnects comprises one or more first layer MEOL interconnects, each of the one or more first layer MEOL interconnects configured to connect a corresponding transistor to a corresponding second layer MEOL interconnect.

4. The standard library cell circuit of claim 1, further comprising one or more fixed zero level vias, each of the one or more fixed zero level vias configured to connect a gate of the at least one transistor to the first metal layer.

5. The standard library cell circuit of claim 1, wherein the one or more break regions comprise the first break region configured to:
   separate the first diffusion region and the second diffusion region, wherein the first diffusion region and the second diffusion region each comprise a p-type metal-oxide semiconductor (PMOS) region; and
   separate a third diffusion region and a fourth diffusion region, wherein the third diffusion region and the fourth diffusion region each comprise an n-type metal-oxide semiconductor (NMOS) region.

6. The standard library cell circuit of claim 1, wherein the one or more break regions comprise:
   the first break region, wherein the first break region:
      separates the first diffusion region and the second diffusion region; and
      separates a third diffusion region and a fourth diffusion region; and
   a second break region, wherein the second break region:
      separates the first diffusion region and a fifth diffusion region; and
      separates the third diffusion region and a sixth diffusion region.

7. The standard library cell circuit of claim 6, further comprising a fixed MEOL interconnect in the second break region.

8. The standard library cell circuit of claim 7, wherein:
   the fixed MEOL interconnect in the first break region comprises a fixed second layer MEOL interconnect configured to connect a plurality of first metal layer segments; and
   the fixed MEOL interconnect in the second break region comprises a fixed second layer MEOL interconnect configured to connect the plurality of first metal layer segments.

9. The standard library cell circuit of claim 1, wherein the first fixed MEOL interconnect in the first break region comprises a fixed second layer MEOL interconnect configured to connect a plurality of first metal layer segments disposed above the at least two diffusion regions of the plurality of diffusion regions.

10. The standard library cell circuit of claim 1 configured to be programmed to function as an inverter.

11. The standard library cell circuit of claim 1 configured to be programmed to function as a buffer.

12. The standard library cell circuit of claim 1 integrated into an integrated circuit (IC).

13. The standard library cell circuit of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

14. The standard library cell circuit of claim 1, wherein the at least one second floating gate is not tied off.

15. The standard library cell circuit of claim 1, wherein:
   the at least one first floating gate extends longitudinally in a first direction;

the at least one second floating gate extends longitudinally in a second direction substantially parallel to the first direction; and the first break region extends longitudinally in a third direction substantially parallel to the first direction.

16. A non-transitory computer-readable medium having stored thereon computer data for a cell library that comprises a plurality of standard library cell circuits for an integrated circuit (IC) design, each of the standard library cell circuits comprising:

at least one transistor;

a plurality of diffusion regions, wherein at least one diffusion region of the plurality of diffusion regions corresponds to the at least one transistor;

one or more break regions separating at least two diffusion regions of the plurality of diffusion regions;

the at least one transistor comprising at least one first floating gate disposed between a first diffusion region among the plurality of diffusion regions and the one or more break regions, the at least one first floating gate not tied off;

at least one second floating gate disposed between a second diffusion region among the plurality of diffusion regions and the one or more break regions;

a first fixed middle-end-of-line (MEOL) interconnect disposed in a first break region of the one or more break regions, the first fixed MEOL interconnect not connected to the at least one first floating gate and the at least one second floating gate; and one or more second fixed MEOL interconnects configured to connect the at least one transistor to a first metal layer, wherein one or more of the one or more second fixed MEOL interconnects comprises one or more tie-off layer interconnects, each of the one or more tie-off layer interconnects configured to tie-off the at least one first floating gate of the at least one transistor so as to deactivate the at least one transistor.

17. A method of manufacturing a standard library cell circuit, comprising:

disposing a plurality of diffusion regions on a substrate;

providing one or more break regions that separate at least two diffusion regions of the plurality of diffusion regions;

forming at least one transistor corresponding to at least one of the plurality of diffusion regions, comprising forming at least one first floating gate disposed between a first diffusion region among the plurality of diffusion regions and the one or more break regions;

not tieing off the at least one first floating gate;

forming at least one second floating gate disposed between a second diffusion region among the plurality of diffusion regions and the one or more break regions;

disposing a first fixed middle-end-of-line (MEOL) interconnect in a first break region of the one or more break regions;

not connecting the first fixed MEOL interconnect to the at least one first floating gate and the at least one second floating gate; and disposing one or more second fixed MEOL interconnects configured to connect the at least one transistor to a first metal layer, wherein disposing the one or more second fixed MEOL interconnects configured to connect the at least one transistor to the first metal layer comprises disposing one or more tie-off layer interconnects configured to tie-off the at least one first floating gate of the at least one transistor so as to deactivate the at least one transistor.

18. The method of claim 17, wherein disposing the one or more second fixed MEOL interconnects configured to connect the at least one transistor to the first metal layer comprises disposing a fixed second layer MEOL interconnect configured to connect a plurality of first metal layer segments in the first break region of the one or more break regions.

19. The method of claim 17, wherein disposing the one or more second fixed MEOL interconnects configured to connect the at least one transistor to the first metal layer comprises disposing one or more first layer MEOL interconnects configured to connect the at least one transistor to a corresponding second layer MEOL interconnect.

20. The method of claim 17, wherein disposing the one or more second fixed MEOL interconnects configured to connect the at least one transistor to the first metal layer comprises disposing one or more fixed zero level vias configured to connect a corresponding gate of the at least one transistor to the first metal layer.

21. A method for programming an engineering change order (ECO) standard library cell circuit, comprising:

configuring one or more non-fixed zero level vias to be disposed on one or more fixed second layer middle-end-of-line (MEOL) interconnects, wherein one of the one or more fixed second layer MEOL interconnects is disposed in a break region that separates two or more diffusion regions;

configuring one or more first metal layer segments to be disposed so that one or more of the one or more first metal layer segments couples to one or more of the one or more non-fixed zero level vias;

configuring one or more of the one or more first metal layer segments to be disposed so that one or more of the one or more first metal layer segments couples to one or more fixed zero level vias, wherein one or more of the one or more fixed zero level vias comprises one or more tie-off layer interconnects, each of the one or more tie-off layer interconnects configured to tie-off a gate of at least one transistor so as to deactivate the at least one transistor;

configuring at least one first floating gate to be disposed between a first diffusion region among the two or more diffusion regions and the break region, the at least one first floating gate not tied off;

configuring at least one second floating gate to be disposed between a second diffusion region among the two or more of diffusion regions and the break region; and configuring the one or more fixed second layer MEOL interconnects to not be connected to the at least one first floating gate and the at least one second floating gate.

22. The method of claim 21, wherein configuring the one or more non-fixed zero level vias and the one or more first metal layer segments comprises configuring the one or more non-fixed zero level vias and the one or more first metal layer segments so that the ECO standard library cell circuit functions as an inverter.

23. The method of claim 21, wherein configuring the one or more non-fixed zero level vias and the one or more first metal layer segments comprises configuring the one or more non-fixed zero level vias and the one or more first metal layer segments so that the ECO standard library cell circuit functions as a buffer.

* * * * *